(12) United States Patent
Basker et al.

(10) Patent No.: US 9,985,032 B2
(45) Date of Patent: May 29, 2018

(54) SELECTIVELY DEGRADING CURRENT RESISTANCE OF FIELD EFFECT TRANSISTOR DEVICES

(71) Applicant: International Business Machines Corporation, Armonk, NY (US)

(72) Inventors: Veeraraghavan S. Basker, Schenectady, NY (US); Effendi Leobandung, Stormville, NY (US); Dieter Wendel, Boeblingen (DE); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/177,757

(22) Filed: Jun. 9, 2016

(65) Prior Publication Data

US 2016/0293611 A1    Oct. 6, 2016

Related U.S. Application Data

(62) Division of application No. 14/578,778, filed on Dec. 22, 2014, now Pat. No. 9,373,550.

(Continued)

(51) Int. Cl.
*H01L 27/00* (2006.01)
*H01L 27/092* (2006.01)
(Continued)

(52) U.S. Cl.
CPC .. *H01L 27/0924* (2013.01); *H01L 21/823418* (2013.01); *H01L 21/823431* (2013.01); *H01L 21/823814* (2013.01); *H01L 21/823821* (2013.01); *H01L 21/823871* (2013.01); *H01L 27/0886* (2013.01); *H01L 27/1104* (2013.01);
(Continued)

(58) Field of Classification Search
CPC ..... H01L 21/823814; H01L 21/823821; H01L 21/823871; H01L 21/823418; H01L 21/823431; H01L 27/0924; H01L 27/0886; H01L 27/1104; H01L 27/1108; H01L 29/161; H01L 29/167; H01L 29/7848; H01L 29/7855
See application file for complete search history.

(56) References Cited

U.S. PATENT DOCUMENTS 8,689,157 B1    4/2014    Lo et al.
9,373,550 B2    6/2016    Basker et al.
(Continued)

OTHER PUBLICATIONS

Basker, Veeraraghavan S., et al.; "Selectively Degrading Current Resistance of Field Effect Transistor Devices"; U.S. App. No. 15/177,768, filed Jun. 9, 2016.
(Continued)

*Primary Examiner* — Armando Rodriguez
(74) *Attorney, Agent, or Firm* — Cantor Colburn LLP; Vazken Alexanian

(57) ABSTRACT

A method includes selectively degrading a current capacity of a first finned-field-effect-transistor (finFET) relative to a second finFET by forming a material on a fin of the first finFET to increase a current resistance of the first finFET. The second finFET is electrically connected to the first finFET in a circuit such that a current flow through the second finFET is a multiple of a current flow through the first finFET.

15 Claims, 19 Drawing Sheets

Related U.S. Application Data

(60) Provisional application No. 61/982,930, filed on Apr. 23, 2014.

(51) Int. Cl.
*H01L 21/8238* (2006.01)
*H01L 21/8234* (2006.01)
*H01L 27/088* (2006.01)
*H01L 27/11* (2006.01)
*H01L 29/161* (2006.01)
*H01L 29/167* (2006.01)

(52) U.S. Cl.
CPC ........ *H01L 27/1108* (2013.01); *H01L 29/161* (2013.01); *H01L 29/167* (2013.01)

(56) References Cited

U.S. PATENT DOCUMENTS

| | | |
|---|---|---|
| 9,425,319 B2 | 8/2016 | Cai et al. |
| 2013/0270639 A1 | 10/2013 | Lee et al. |

OTHER PUBLICATIONS

List of IBM Patents or Patent Applications Treated as Related—Date Filed: Jul. 14, 2016; 2 pages.

SELECTIVELY DEGRADING CURRENT RESISTANCE OF FIELD EFFECT TRANSISTOR DEVICES

DOMESTIC PRIORITY

This application is a divisional of and claims priority to U.S. Nonprovisional application Ser. No. 14/578,778, entitled "SELECTIVELY DEGRADING CURRENT RESISTANCE OF FIELD EFFECT TRANSISTOR DEVICES," filed Dec. 22, 2014, which claims priority to U.S. Provisional Application No. 61/982,930, entitled "SELECTIVELY DEGRADING CURRENT RESISTANCE OF FIELD EFFECT TRANSISTOR DEVICES," filed Apr. 23, 2014, which is incorporated herein by reference in its entirety.

BACKGROUND

The present invention relates to fin field-effect transistors (finFETs), and more specifically, to degrading the current resistance characteristics of finFETs to improve circuit characteristics.

Field-effect transistors (FETs) generate an electric field, by a gate structure, to control the conductivity of a channel between source and drain structures in a semiconductor substrate. The source and drain structures may be formed by doping the semiconductor substrate, a channel region may extend between the source and the drain on the semiconductor substrate and the gate may be formed on the semiconductor substrate between the source and drain regions.

Current flowing through finFET devices may be adjusted by adjusting the size or number of fins of the devices. In some circuits, two finFET devices that are electrically connected and have the same number of fins will have different current resistances or drive currents. As a result, a first finFET having only one fin may drive twice as much current as a second finFET having only one fin, and the second finFET will need to be designed with multiple fins to accommodate the increased current. The increased number of fins increases the size of circuits that utilize the finFETs.

SUMMARY

According to one embodiment of the present invention, a method includes selectively degrading a current capacity of a first finned-field-effect-transistor (finFET) relative to a second finFET by forming a material on a fin of the first finFET to increase a current resistance of the first finFET. The second finFET is electrically connected to the first finFET in a circuit such that a current flow through the second finFET is a multiple of a current flow through the first finFET.

According to another embodiment of the present invention, an article includes an electrical circuit includes a first finFET having a first channel charge type and a second finFET having the first channel charge type. The second finFET has a material formed on a fin of the second finFET to increase a current resistance of the second finFET relative to the first finFET. The circuit includes one or more third finFETs having a second channel charge type opposite the first channel charge type. The one or more third finFETs are electrically connected to the second finFET, such that a current flow through the one or more third finFETs is a multiple greater than one of a current flow through the second finFET.

According to one embodiment of the present invention, a method for selectively degrading a current capacity of a finned-field-effect-transistor (finFET) includes forming a first finFET and a second finFET on a substrate and implanting the second finFET with an implantation material to alter an ability of a fin of the second finFET to grow an epitaxial layer. The method includes epitaxially growing a first epitaxial layer on a fin of the first finFET and a second epitaxial layer on a fin of the second finFET, the first epitaxial layer having a height different than the second epitaxial layer due to the implantation material in the fin of the second finFET.

According to another embodiment of the present invention, a finFET semiconductor device includes a first finFET having a first fin, a first epitaxial layer on the first fin, and a first gate and a second finFET having a second fin, a second epitaxial layer on the second fin, and a second gate. The first and second fins have a same height, the second fin includes an implantation material that alters an ability of an epitaxial layer to grow on the second fin relative to the first fin, and the second epitaxial layer has a height different than the first epitaxial layer based on the implantation material.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Circuits that include multiple finFET devices require some finFETs be designed with multiple fins to accommodate different current capacities of the different finFETs. Embodiments of the invention relate to degrading the current capacity of a finFET to reduce circuit size.

Figure 1:
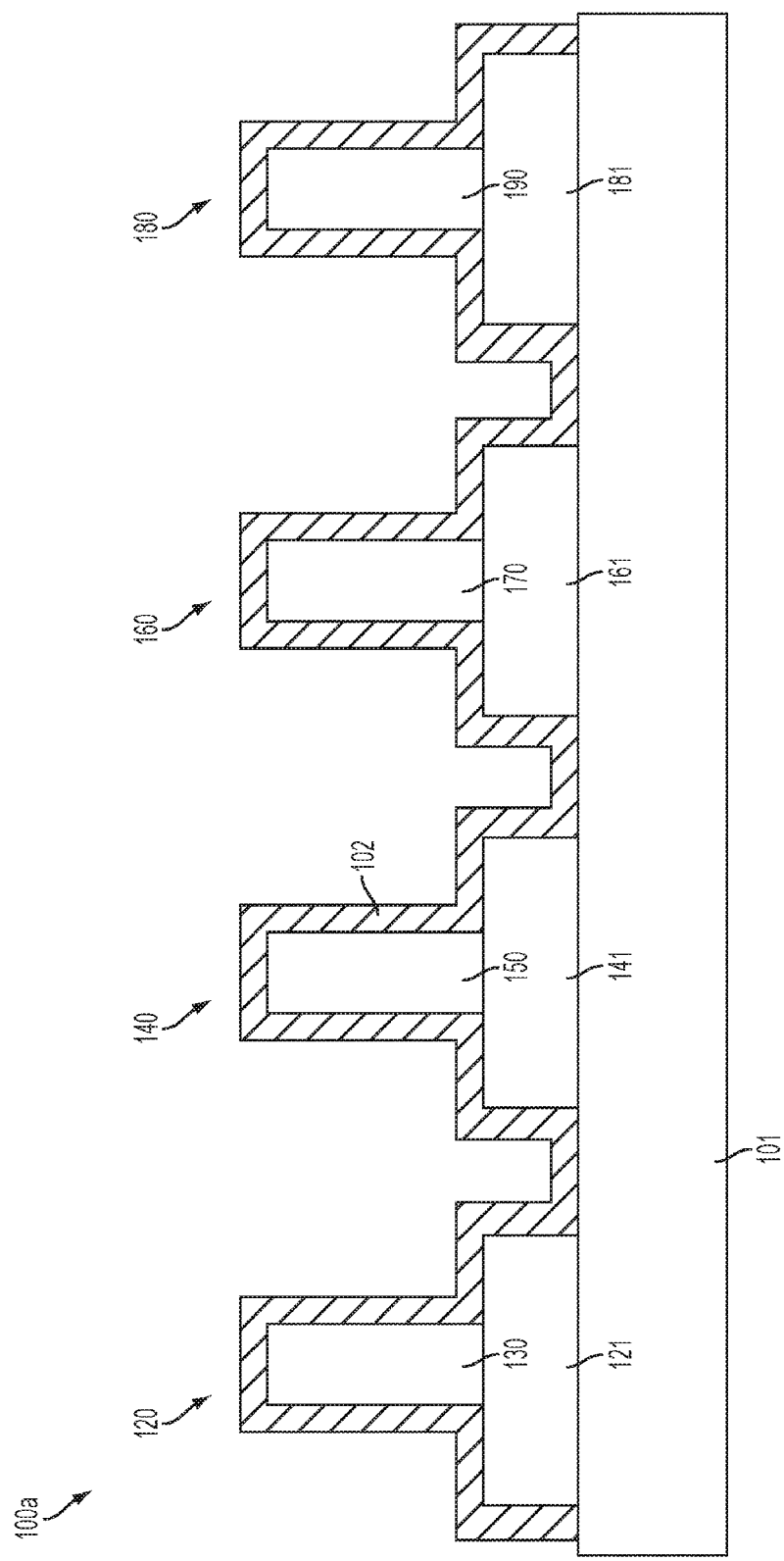
FIG. 1 illustrates an intermediate finFET semiconductor device according to an embodiment of the invention, having a substrate, a first finFET, a second finFET, a third finFET, and a fourth finFET.

FIG. 1 illustrates a cross-section of an intermediate fin field-effect transistor (finFET) device 100a according to an embodiment of the invention. In the present specification and claims, an "intermediate" finFET device is defined as a finFET device in a stage of fabrication prior to a final stage. The finFET device 100a includes a substrate 101, a first finFET 120, a second finFET 140, a third finFET 160, and a fourth finFET 180. In one embodiment, the first finFET 120 is a logic PFET (referred to herein as a fin-PFET), the second finFET 140 is a logic NFET (referred to herein as a fin-NFET), the third finFET 160 is an SRAM PFET, and the fourth finFET 180 is an SRAM NFET. However, the invention is not limited to utilizing the finFETs 120, 140, 160, and 180 in logic and SRAM, but in any environment in which it is desired to degrade a current capacity of one or more of the finFETs 120, 140, 160, and 180 relative to the others.

In one embodiment, the third finFET 160 is electrically connected to one or more of the second finFET 140 and the fourth finFET 180 in an electrical circuit, such as by conductive wiring. In one embodiment, the second finFET 140 or fourth finFET 180 is configured to have a drive current that is a positive multiple greater than one of the drive current through the third finFET 140. In other words, if the third finFET 160 is configured to pass Y amps of current, then the second or fourth finFETs 140 or 180 connected to the third finFET 160 is configured to pass Y×Z amps of current, where Z is a number greater than one.

The first finFET 120 includes a fin 121 and a gate 130. The second finFET 140 includes a fin 141 and a gate 150. The third finFET 130 includes a fin 161 and a gate 170. The fourth finFET 180 includes a fin 181 and a gate 190. In one embodiment, the fins 121, 141, 161, and 181 are made of silicon. The first to fourth finFETs 120, 140, 160, and 180 are covered by an insulation layer 102, such as a nitrite layer. The first to fourth finFETs 120, 140, 160, and 180 are formed on the same substrate 101.

Figure 2:
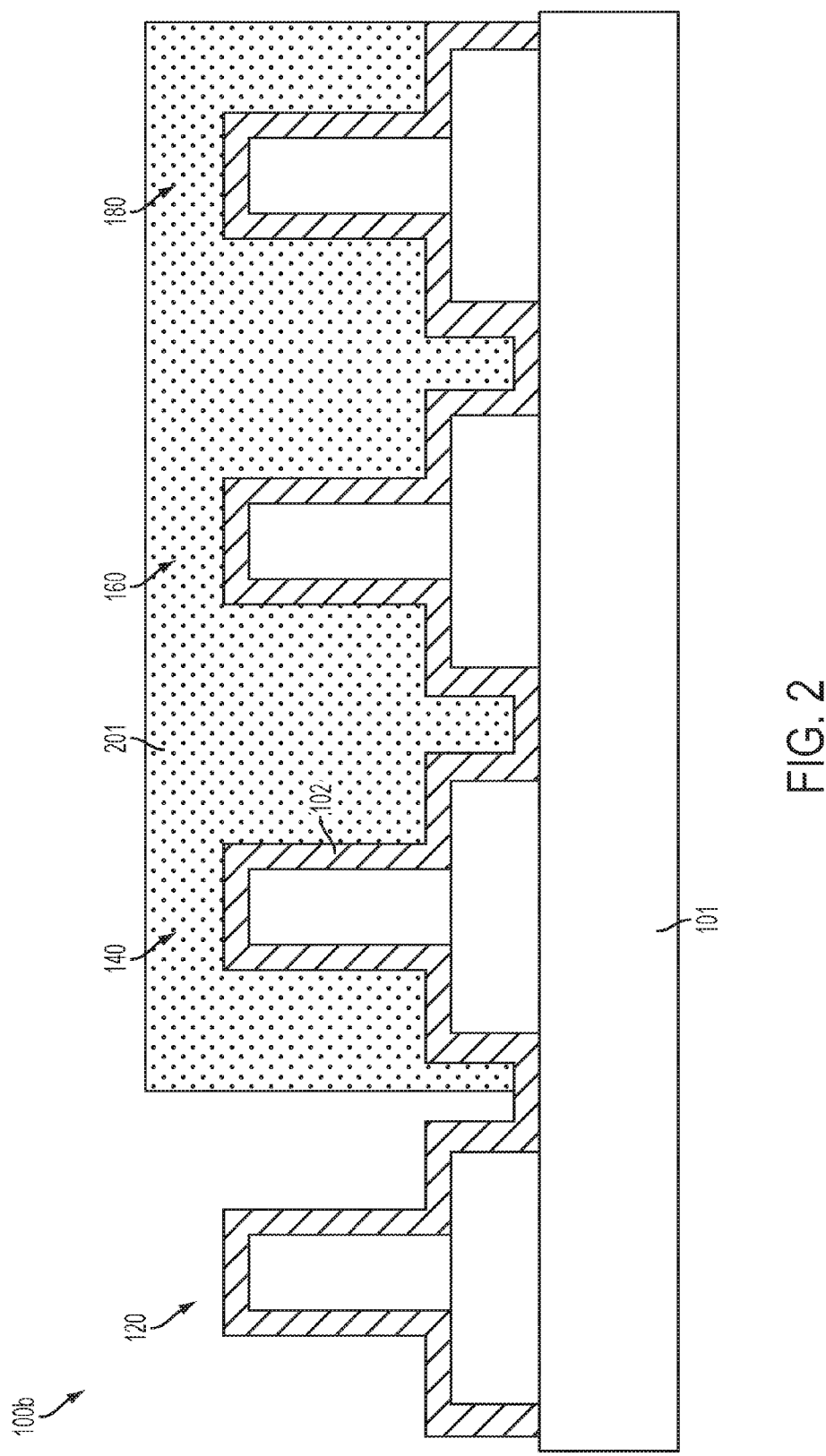
FIG. 2 illustrates the intermediate finFET semiconductor device of FIG. 1 following the formation of a mask over the second to fourth finFETs.

In FIG. 2, an intermediate fin field-effect transistor (finFET) device 100b is shown having a mask 201 placed over the second to fourth finFETs 140, 160, and 180. The mask 201 may be a lithographic material, for example. In an embodiment in which the first finFET 120 is a logic PFET, the logic PFET is maintained outside the mask 201.

Figure 3:
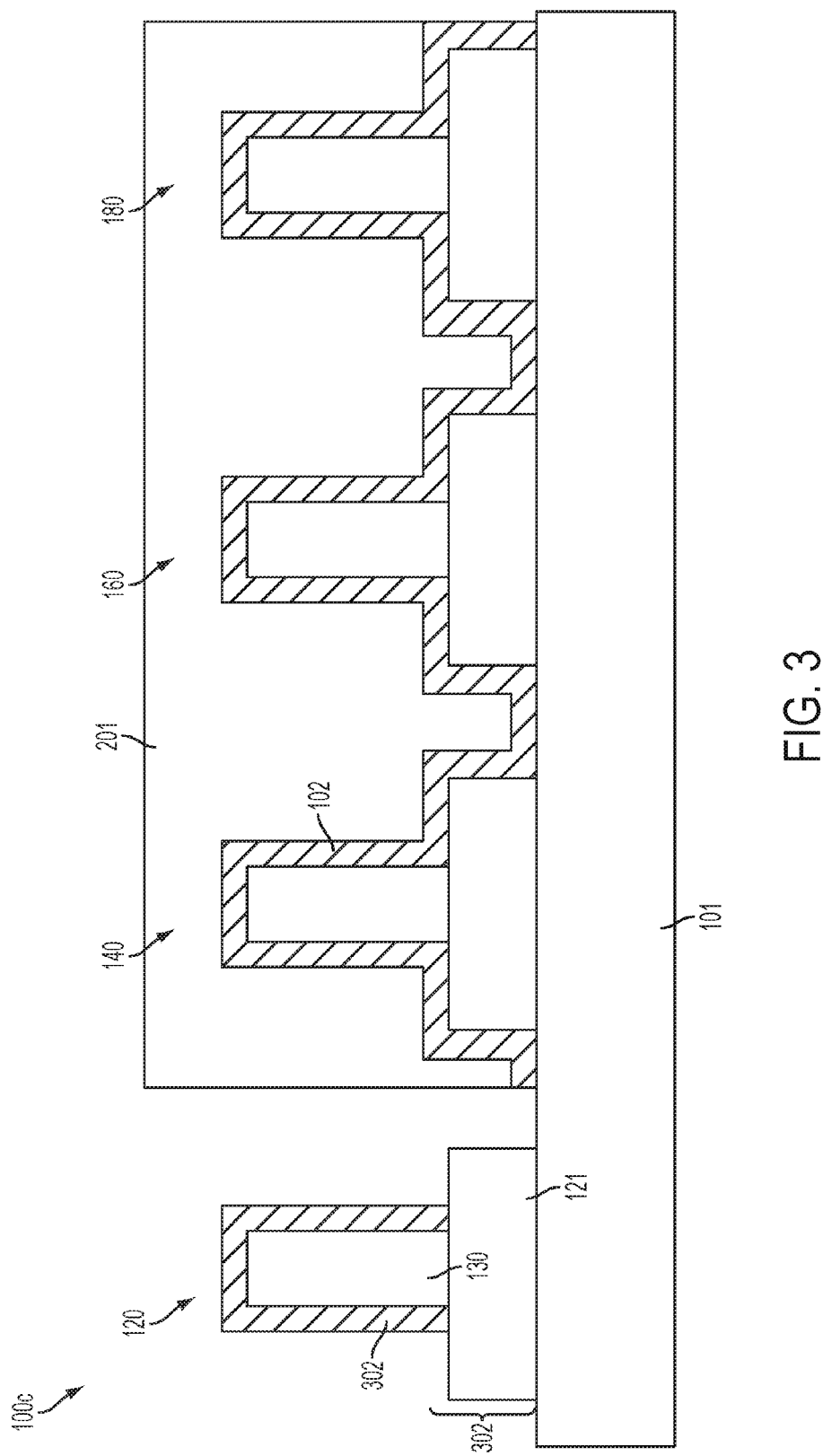
FIG. 3 illustrates the intermediate finFET semiconductor device of FIG. 2 after an etching process.

In FIG. 3, an intermediate fin field-effect transistor (finFET) device 100c is shown on which an etching process has been performed, and the portions of the insulation layer 102 on the fin 121 of the first finFET 120 are removed by the etching process, resulting in a spacer 301 formed of the insulating layer 102 on the gate 130 of the first finFET 120. The regions removed are designated by the reference numeral 302. Since the second, third, and fourth finFETs 140, 160, and 180 are covered by the mask 201, these finFETs 140, 160, and 180 are not etched. In one embodiment, the etching is reaction ion etching (ME), although embodiments of the invention encompass any type of etching or process to selectively remove portions of the nitrite layer 102.

Figure 4:
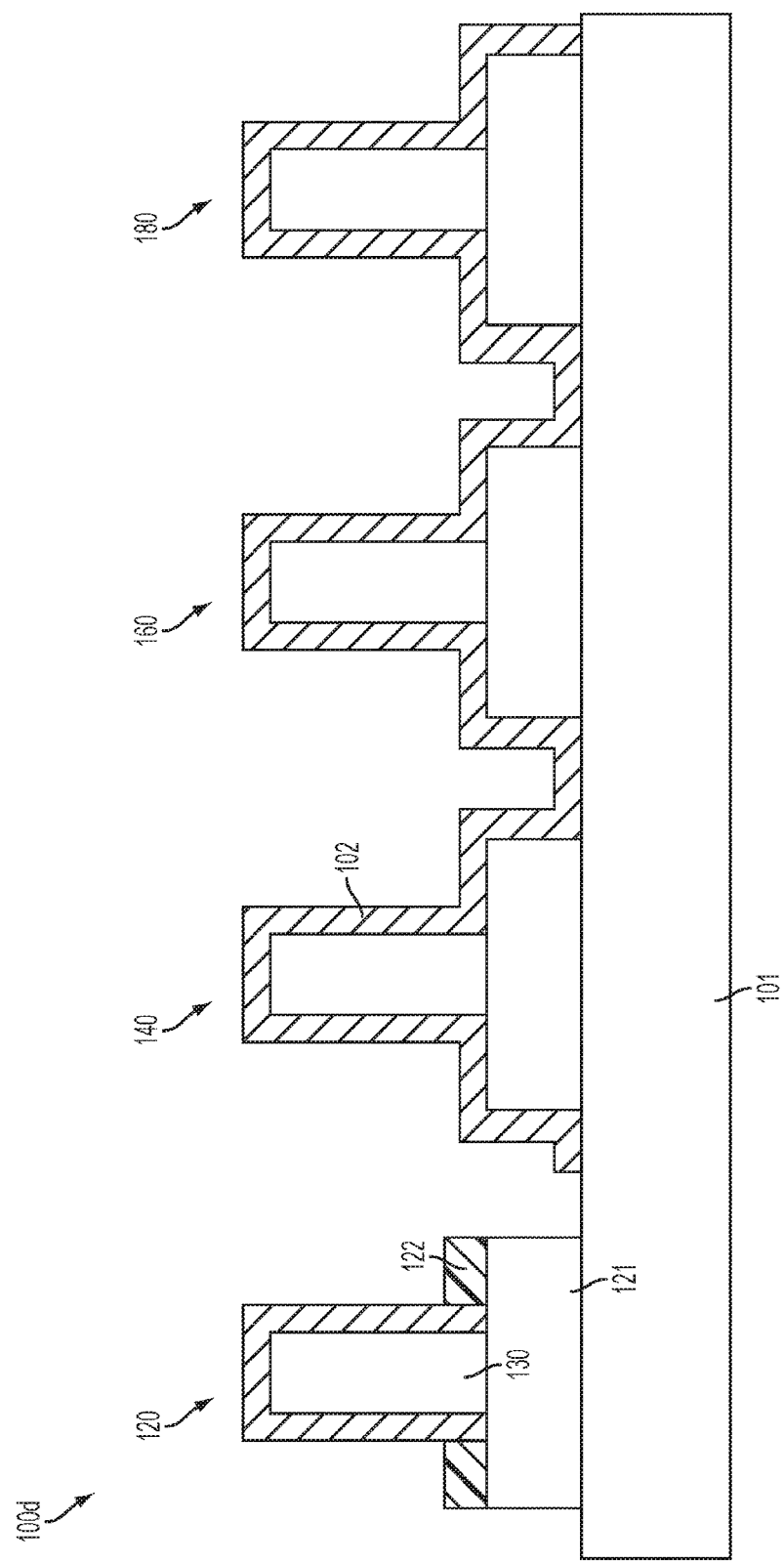
FIG. 4 illustrates the intermediate finFET semiconductor device of FIG. 3 after forming an epitaxial layer on a fin of the first finFET according to an embodiment of the invention.

In FIG. 4, an intermediate fin field-effect transistor (finFET) device 100d is shown having a silicon layer 122 formed on the fin 121. In one embodiment, the layer 122 is a silicon germanium (SiGe) layer. In one embodiment, the layer 122 is a boron-doped SiGe layer. In one embodiment, the SiGe layer is grown epitaxially on the fin 121. In the embodiment illustrated in FIG. 4, the layer 122 is formed on the fin 121 of the first finFET 120 separately from the other finFETs 140, 160, and 180. For example, in the embodiment in which the finFET 120 is a logic PFET and the finFET 160 is an SRAM PFET, the silicon germanium layer 122 is grown epitaxially on the fin 121 of the logic PFET separately, or at a different time in the fabrication process, than an epitaxial layer grown on the SRAM PFET.

Figure 5:
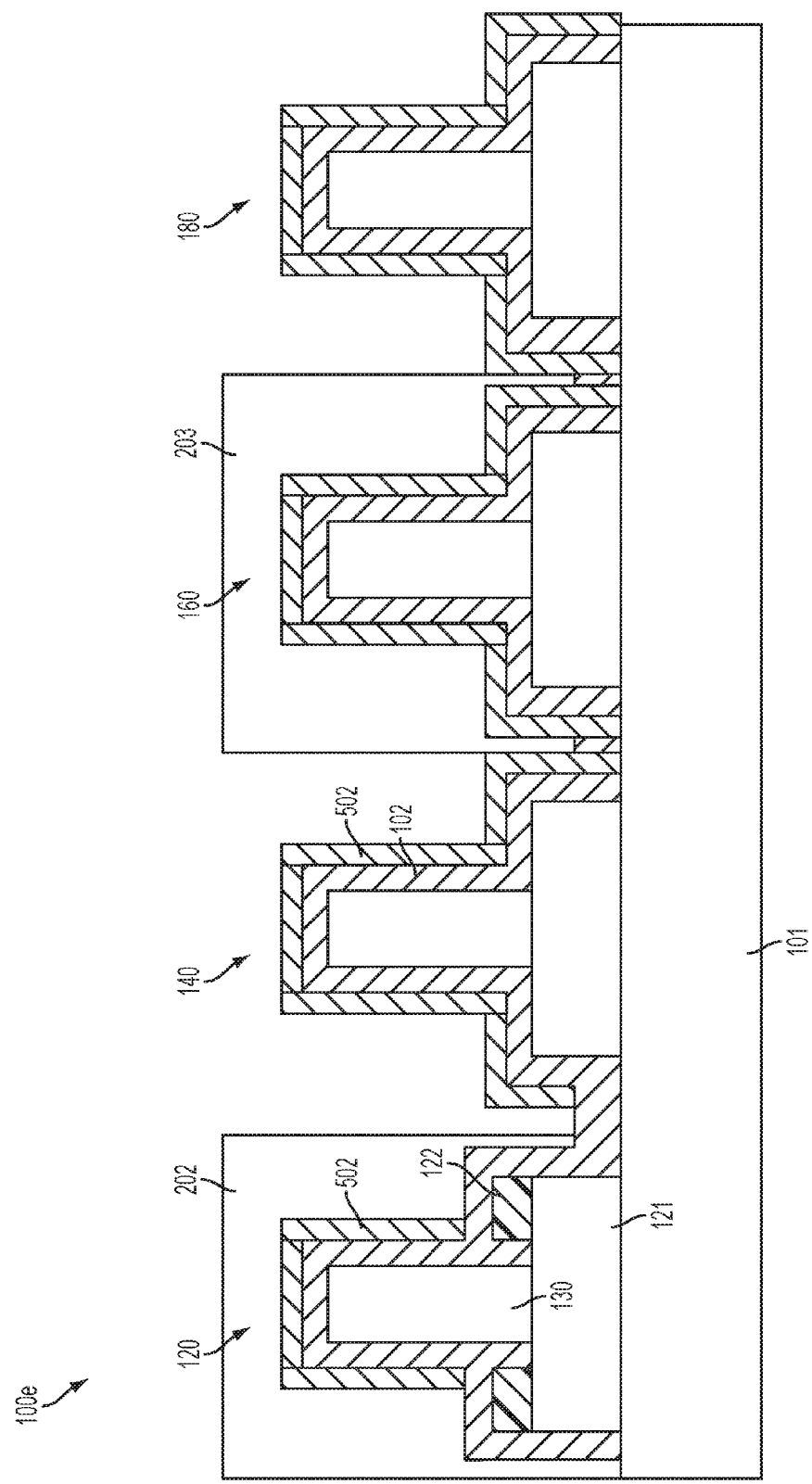
FIG. 5 illustrates the intermediate finFET semiconductor device of FIG. 4 following the formation of a mask layer over the first and third finFETs according to an embodiment of the invention.

In FIG. 5, an intermediate fin field-effect transistor (finFET) device 100e is shown having an additional insulation layer 502, such as a nitrite layer, formed on the previously-existing insulation layer 102. In addition, mask layers 202 and 203, which may be lithographic layers, are formed on the first and third finFETs 120 and 160. In the embodiment in which the first and third finFETs 120 and 160 are a logic PFET and an SRAM PFET, the second and fourth finFETs 140 and 180, which are a logic NFET and an SRAM NFET, are exposed.

Figure 6:
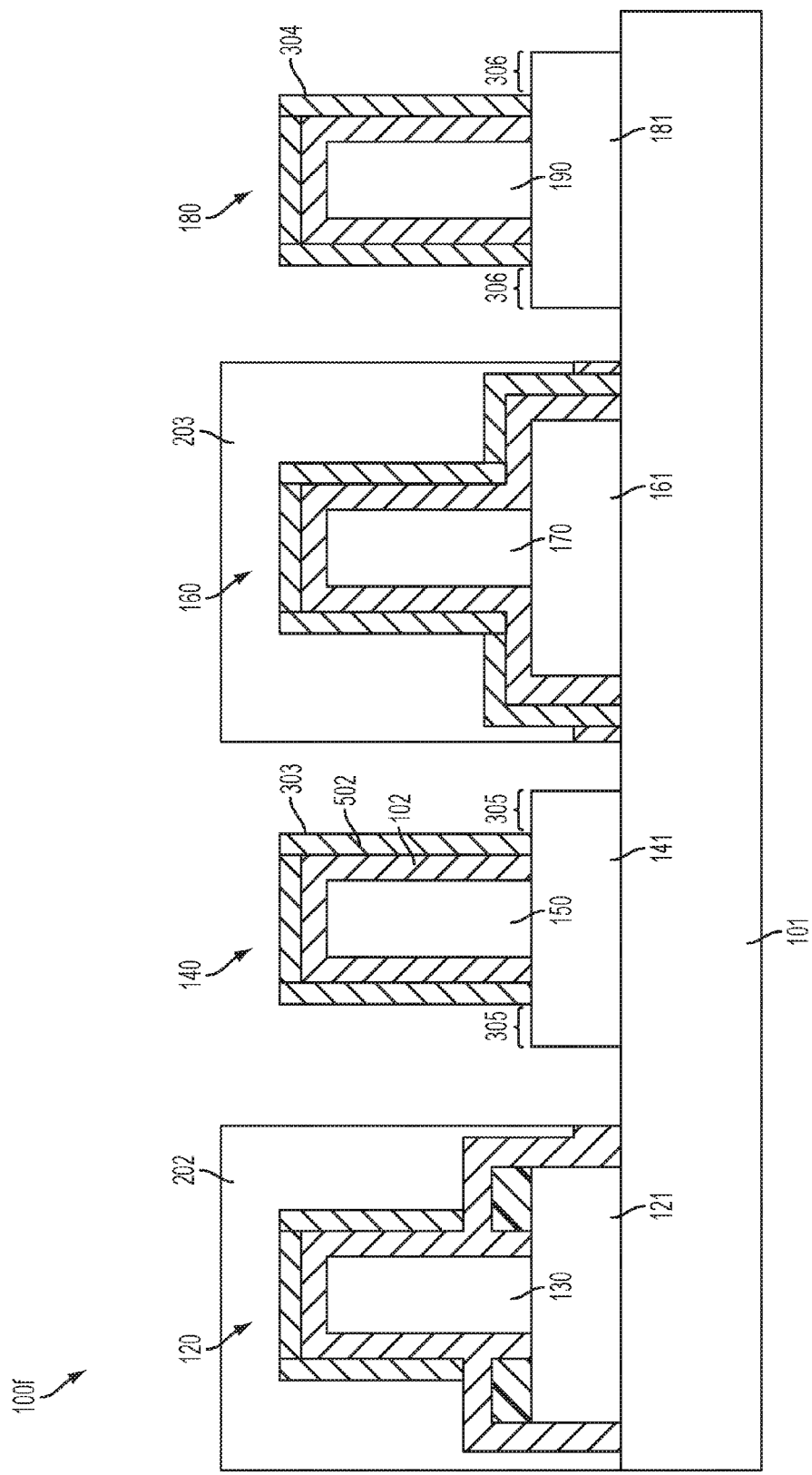
FIG. 6 illustrates the intermediate finFET semiconductor device of FIG. 5 after an etching process according to an embodiment of the invention.

In FIG. 6, an intermediate fin field-effect transistor (finFET) device 100f is shown on which an etching process has been performed, and the portions of the insulation layers 102 and 502 on the fins 141 and 181 of the second finFET 140 and the fourth finFET 180 are removed by the etching process, resulting in a spacer 303 formed of the insulating layers 102 and 502 on the gate 150 of the second finFET 140. The etching also results in a spacer 304 formed of the insulating layers 102 and 502 on the gate 190 of the fourth finFET 180. The regions removed are designated by the reference numerals 305 and 306. Since the first and third finFETs 120 and 160 are covered by the masks 202 and 203, these finFETs 120 and 160 are not etched. In one embodiment, the etching is reaction ion etching (ME), although embodiments of the invention encompass any type of etching or process to selectively remove portions of the nitride layers 102 and 502.

Figure 7:
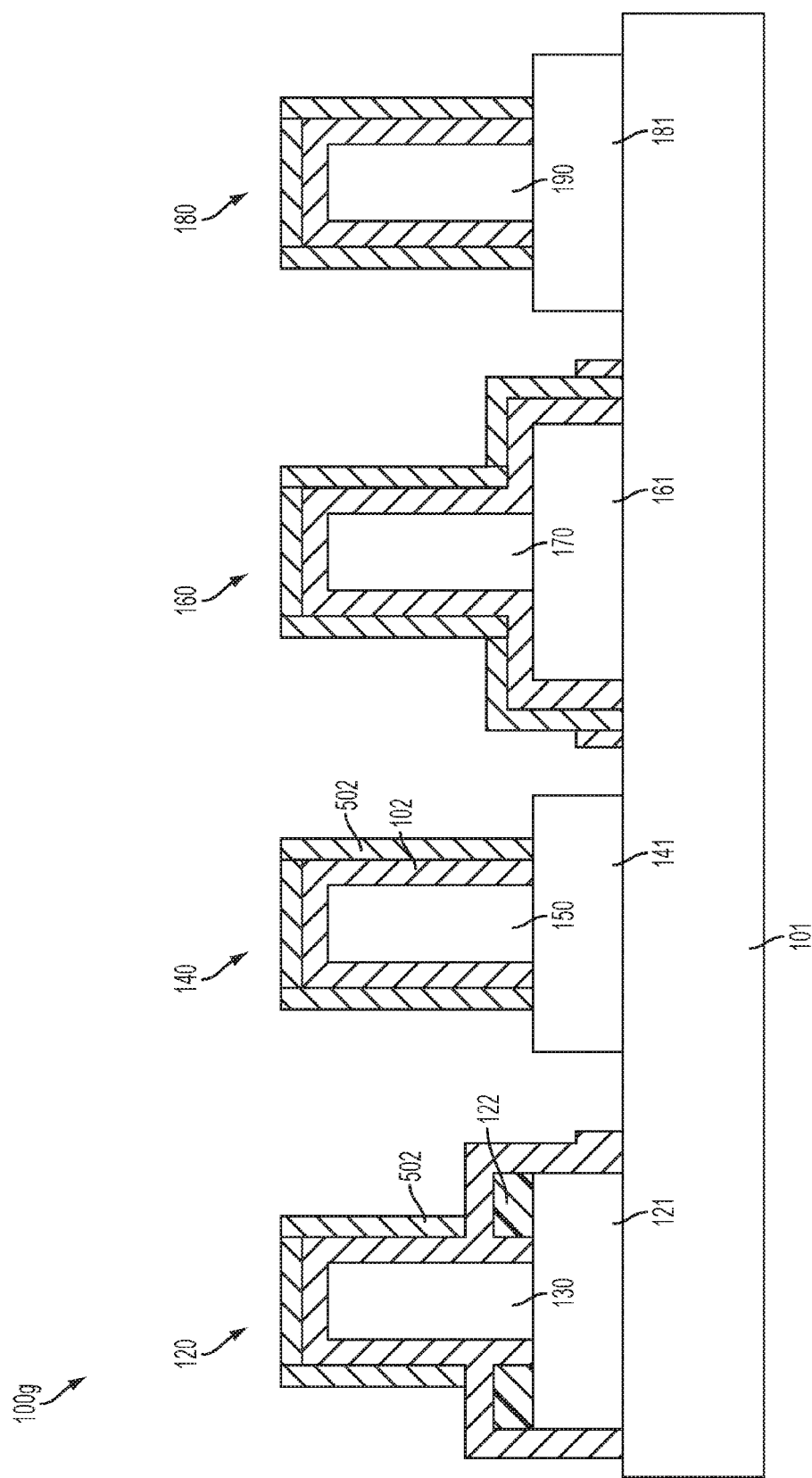
FIG. 7 illustrates the intermediate finFET semiconductor device of FIG. 6 having the mask layers removed according to an embodiment of the invention.

In FIG. 7, an intermediate fin field-effect transistor (finFET) device 100g is shown having the masks 202 and 203 removed.

Figure 8:
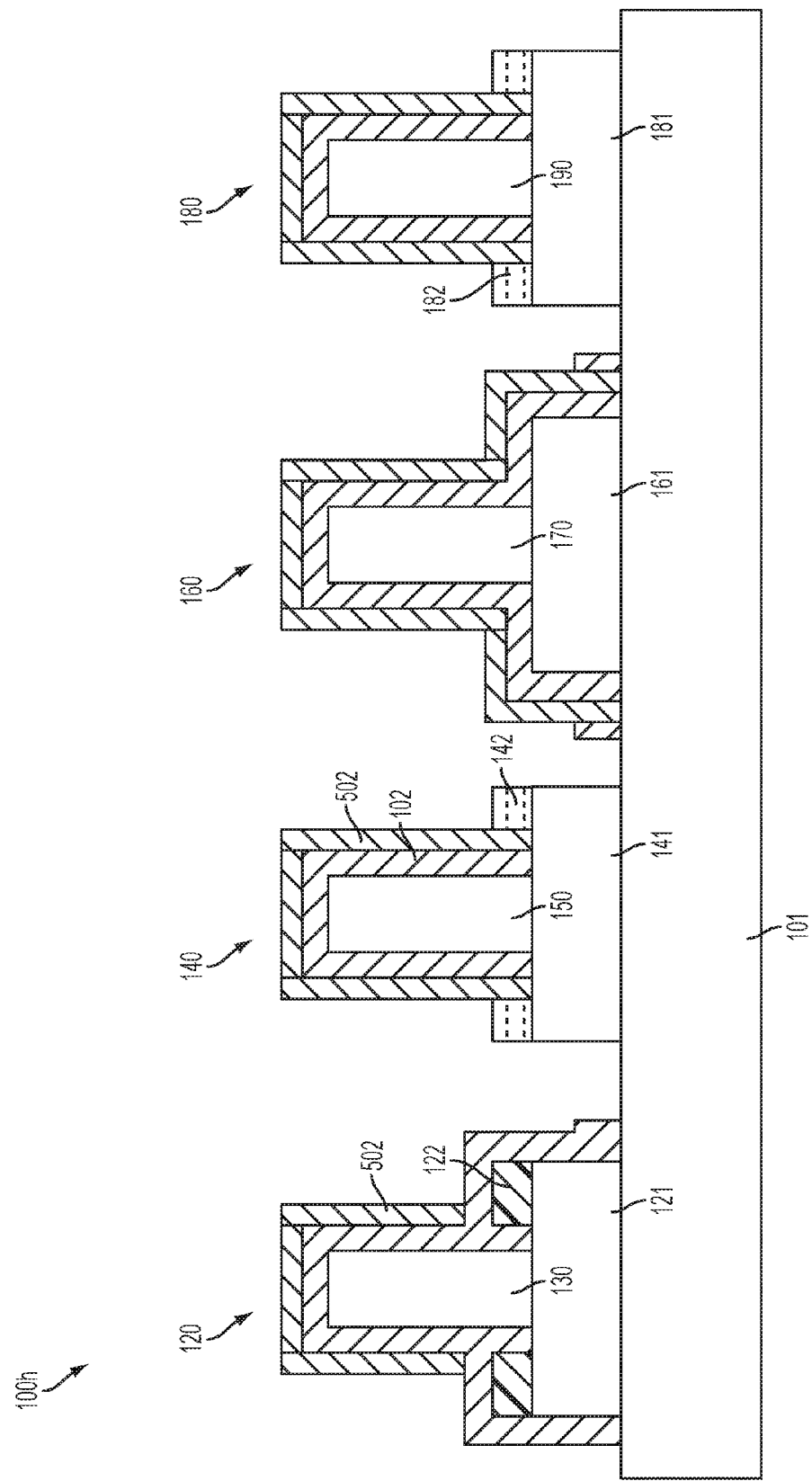
FIG. 8 illustrates the intermediate finFET semiconductor device of FIG. 8 having epitaxial layers formed on the fins of the second and fourth finFETs according to an embodiment of the invention.
Figure 9:
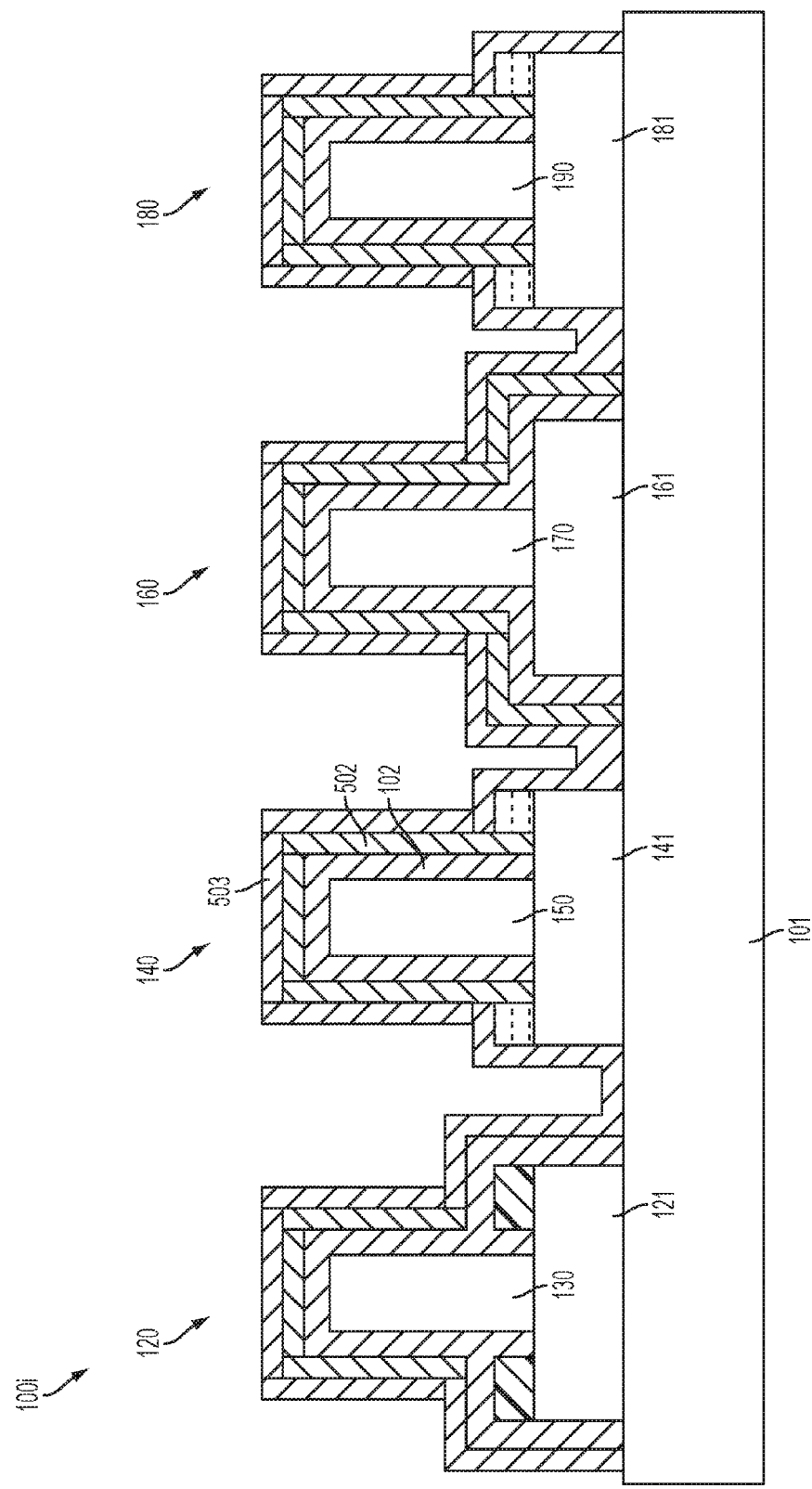
FIG. 9 illustrates the intermediate finFET semiconductor device having another insulation layer deposited according to an embodiment of the invention.

In FIG. 8, an intermediate fin field-effect transistor (finFET) device 100h is shown having a silicon layer 142 formed on the fin 141 of the second finFET 140 and a silicon layer 182 formed on the fin 111 of the fourth finFET 180. In one embodiment, the layers 142 and 182 are silicon phosphorus (SiP) layers. In one embodiment, the SiP layers are grown epitaxially on the fins 141 and 181. In the embodiment illustrated in FIG. 8, the layer 142 and 182 are formed simultaneously on the fins 141 and 181. For example, in the embodiment in which the finFET 120 is a logic PFET, the finFET 140 is a logic NFET, the finFET 160 is an SRAM PFET and the finFET 180 is an SRAM NFET, the SiP layers are grown simultaneously on the logic NFET and the SRAM NFET In FIG. 9, an intermediate fin field-effect transistor (finFET) device 100i is shown having an additional insulation layer 503, such as a nitrite layer, formed on the previously-existing insulation layers 502 and 102.

Figure 10:
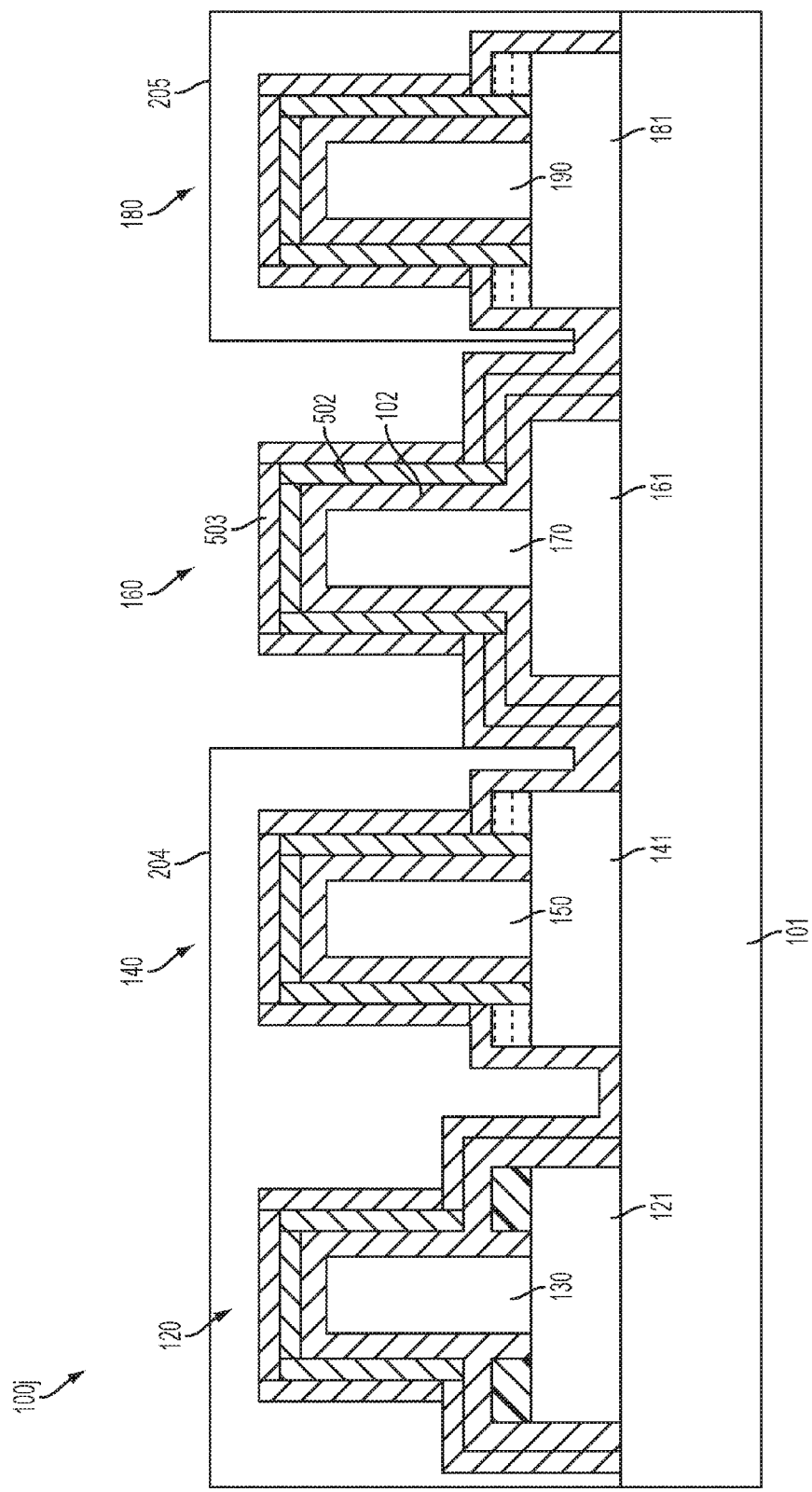
FIG. 10 illustrates the intermediate finFET semiconductor device of FIG. 9 following the formation of a mask layer over the first, second, and fourth finFETs according to an embodiment of the invention.

In FIG. 10, an intermediate fin field-effect transistor (finFET) device 100j is shown having mask layers 204 and 205, which may be lithographic layers, formed on the first, second and fourth finFETs 120, 140, and 180, leaving exposed the third finFET 160. In the embodiment in which the finFET 120 is a logic PFET, the finFET 140 is a logic NFET, the finFET 160 is an SRAM PFET and the finFET 180 is an SRAM NFET, the logic NFET, the logic PFET, and the SRAM NFET are masked and the SRAM PFET is exposed.

Figure 11:
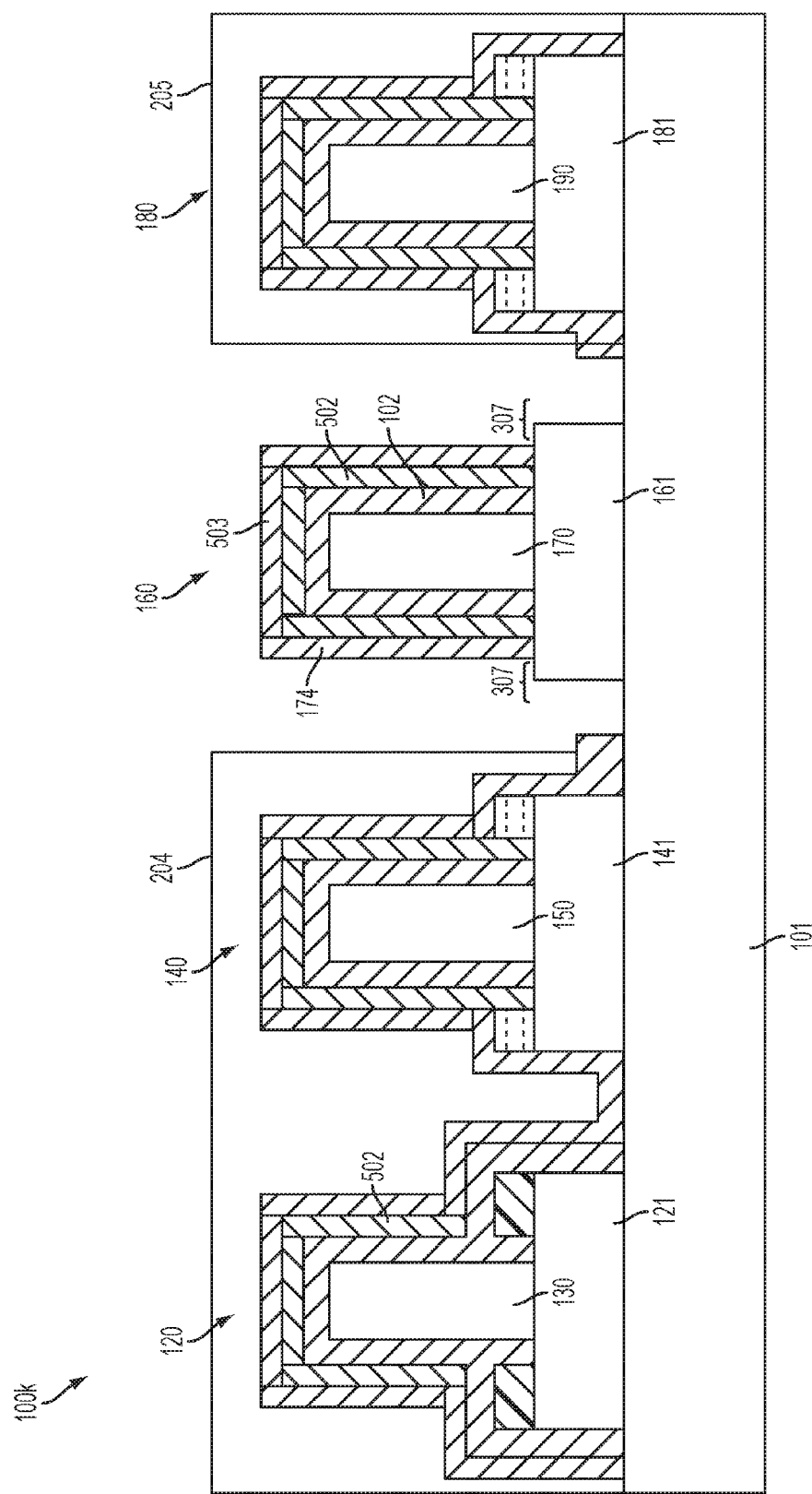
FIG. 11 illustrates the intermediate finFET semiconductor device of FIG. 10 after an etching process according to an embodiment of the invention.

In FIG. 11, an intermediate fin field-effect transistor (finFET) device 100k is shown on which an etching process has been performed, and the portions of the insulation layers 102, 502, and 503 on the fin 161 of the third finFET 160 are removed by the etching process, resulting in a spacer 174. The regions removed are designated by the reference numeral 307. Since the first, second, and fourth finFETs 120, 140, and 180 are covered by the masks 204 and 205, these finFETs 120, 140, and 180 are not etched. In one embodiment, the etching is reaction ion etching (RIE), although embodiments of the invention encompass any type of etching or process to selectively remove portions of the insulation layers 102, 502, and 503.

Figure 12:
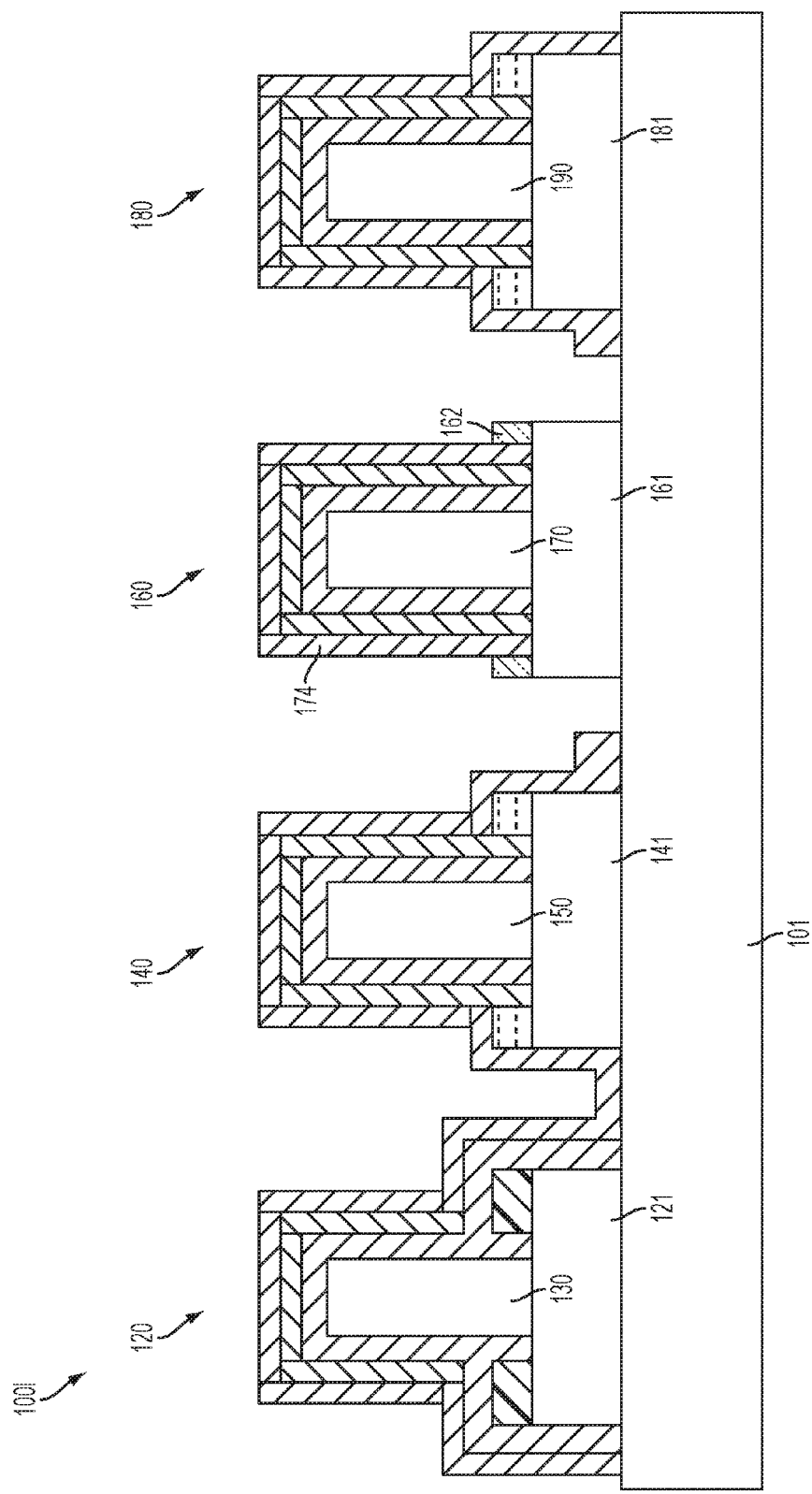
FIG. 12 illustrates the intermediate finFET semiconductor device of FIG. 11 having an epitaxial layer formed on a fin of the third finFET according to an embodiment of the invention.

In FIG. 12, an intermediate fin field-effect transistor (finFET) device 100l is shown having a silicon layer 162 formed on the fin 161. In one embodiment, the layer 162 is a a non-doped silicon layer. In one embodiment, the non-doped silicon layer is grown epitaxially on the fin 161. In the embodiment illustrated in FIG. 12, the layer 162 is formed on the fin 161 of the third finFET 160 separately from the other finFETs 120, 140, and 180. For example, in the embodiment in which the finFET 120 is a logic PFET and the finFET 160 is an SRAM PFET, the non-doped silicon layer 162 is grown epitaxially on the fin 161 separately, or at a different time in the fabrication process, than an epitaxial layer grown on the fin 121.

Figure 13:
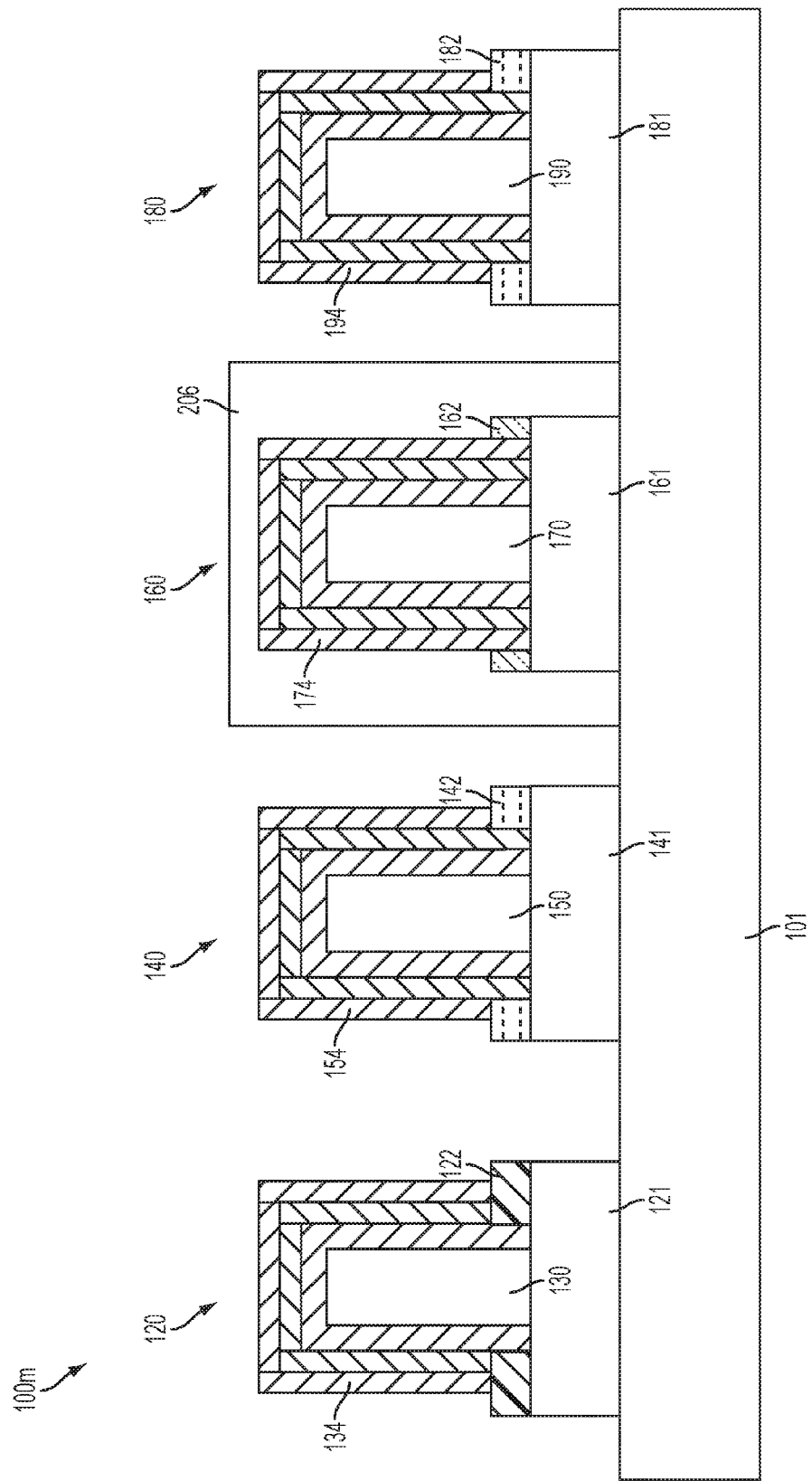
FIG. 13 illustrates the intermediate finFET semiconductor device of FIG. 12 following the formation of a mask layer over the third finFET according to an embodiment of the invention.

In FIG. 13, an intermediate fin field-effect transistor (finFET) device 100m is shown having a mask layer 206 formed on the third finFET 160. An etching has been performed, resulting in the spacers 134, 154, and 194 on the gates 130, 150, and 190. In a subsequent process, the mask 206 may be removed, and any other fabrication may be performed, such as doping, growth of epitaxial layers, removing material, cutting, or performing any other functions to form an electrically operable device.

In one embodiment in which a circuit includes at least two NFETs and two PFETs, and it is required that the finFETs of at least one of the pairs have different current characteristics than the other, the finFETs of the pair are formed with fins having different current resistant characteristics. In an embodiment in which a first PFET is a logic PFET, or a PFET designed to function in a logic circuit, and a second PFET is an SRAM PFET, or a PFET designed to function in an SRAM cell, the first PFET may have a fin made of a material having a lower current resistance than the fin of the second PFET. For example, the fin of the logic PFET may have a fin having an epitaxial layer grown thereon of a boron-doped silicon germanium, and the fin of the SRAM PFET may have a fin having an epitaxial layer grown thereon of a non-doped silicon. Accordingly, the current resistance of the logic PFET is less than that of the SRAM PFET in the same circuit.

Figure 14:
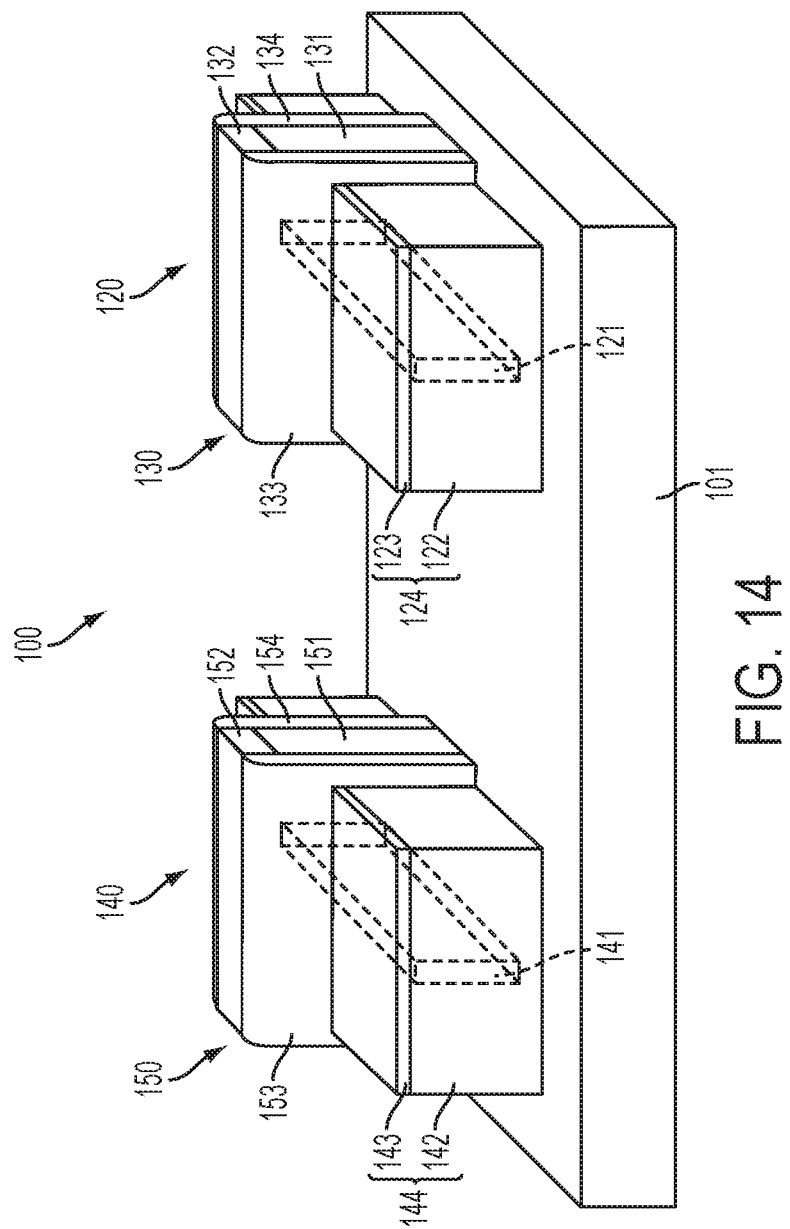
FIG. 14 illustrates a finFET semiconductor device according to an embodiment of the invention.

FIG. 14 illustrates a fin field-effect transistor (finFET) assembly 100 according to an embodiment of the present invention. The finFET assembly 100 includes the substrate 101, a first finFET device 120 and a second finFET device 140. While only two finFET devices are illustrated for purposes of description only, embodiments of the invention encompass any plurality of finFET devices, and in particular, two or more FFET devices configured for performing different functions. The first finFET device 120 includes merged source/drain (SD) regions 124, including a filling layer 122 and a contact layer 123. A gate structure 130 is located between the SD regions 124. In embodiments of the invention, the finFET assembly 100 may represent an electrical circuit connecting the finFETs 120 and 140, a wafer on which the finFETs 120 and 140 are both fabricated or any other assembly including multiple finFETs 120 and 140 formed on the same substrate 101.

The second finFET device 140 also includes merged source/drain (SD) regions 144, including a filling layer 142 and a contact layer 143. The second finFET device 140 also includes a gate structure 150 is located between the SD regions 144.

The first finFET device 120 is formed around a first fin 121 located on the substrate 101, and the second finFET device 140 is formed around a second fin 140 located on the substrate 101. The substrate 101 may include one or more of an insulating material and a semiconductive material, such as a silicon-based material. The fins 121 and 141 may comprise a silicon-based material. In one embodiment, the filling material 122 and 142 may be an epitaxial layer, or a layer of silicon, which may be doped silicon, grown epitaxially on the first and second fins 121 and 141. In the present specification and claims, the filling material 122 and 142 may be referred to as a fill material, filling material, epitaxial fill material, or the like. The contact layers 123 and 143 may include a silicide layer. The filling layers 122 and 142 may be semiconductor layers.

The first gate structure 130 of the first finFET device 120 may include a gate stack layer 131 and a contact layer 132 on the gate stack layer 131. The gate stack layer may include one or more layers of high-dielectric constant (high-k) material under one or more multi-layer metals, doped polysilicon, and silicide. The gate structure 130 may also include insulating layers 133 and 134 disposed on sidewalls of the gate stack layer 131 and contact layer 132. Similarly, the second gate structure 150 of the second finFET device 140 may include a gate stack layer 151 and a contact layer 152 on the gate stack layer 151. The gate structure 150 may also include insulating layers 153 and 154 disposed on sidewalls of the gate stack layer 131 and contact layer 132.

In embodiments of the invention, a first set of similarly-charged finFETs (e.g., NFETs) has the same epitaxial layer grown on the similarly-charged finFETs, and an opposite set of similarly-charged finFETs (e.g., PFETs) has different epitaxial layers grown on the similarly-charged finFETs to alter current characteristics of the finFETs. For example, in one embodiment, a logic PFET has an epitaxial layer grown on the fins having a different doping than an epitaxial layer grown on the fins of an SRAM PFET.

Embodiments of the invention relate to degrading one or more electrically-connected finFETs relative to other finFETs. In one embodiment, a fin-PFET of an SRAM cell is connected to a fin-NFET which acts as a pass gate. If the fin-PFET were doped normally and not degraded, the current flowing through the fin-NFET would be a multiple of the current flowing through the fin-PFET. As a result, if the fin-PFET were to have only one fin, the fin-NFET would require two or more fins, increasing a size of the circuit. In embodiments of the invention, the fin-PFET is degraded to increase a current resistance, decrease a drive current, and decrease a current capacity of the fin-PFET. As a result, a current capacity may be made similar to that of the fin-NFET having only one fin, thereby decreasing the circuit size.

In another embodiment, a ratioed logic circuit includes a keeper fin-PFET connected in series with one or more fin-NFETs, which are connected in parallel with each other. In such an embodiment, the fin-PFET may be degraded to increase the current resistance, decrease the drive current, and decrease the current capacity of the fin-PFET, such that the current decreases through the fin-NFETs, allowing for smaller fin-NFETs having few fins. Embodiments of the invention are not limited to the specific circuits described herein, but to any circuit in which current flowing through a fin-NFET is a multiple of current flowing through a fin-PFET electrically connected to the fin-NFET.

Figure 15:
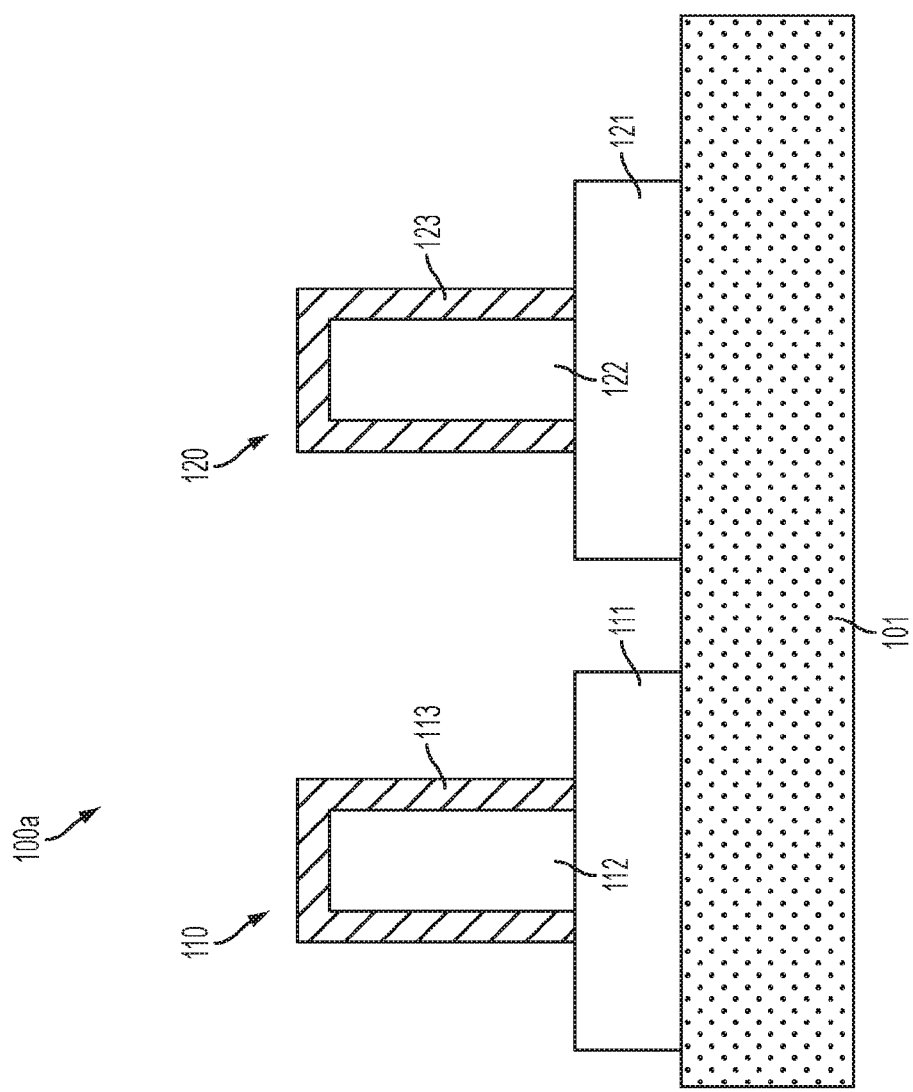
FIG. 15 illustrates an intermediate finFET semiconductor device according to another embodiment of the invention, having a substrate, a first finFET, and a second finFET.

FIG. 15 illustrates a cross-section of an intermediate fin field-effect transistor (finFET) device 100a according to another embodiment of the invention. In the present specification and claims, an "intermediate" finFET device is defined as a finFET device in a stage of fabrication prior to a final stage. The finFET device 100a includes a substrate 101, a first finFET 110, and a second finFET 120. In one embodiment, both the first finFET 110 and the second finFET 120 are of a same charge type, such as both being a P-type finFET. In one embodiment, the first finFET 110 is a logic PFET (referred to herein as a fin-PFET) and the second finFET 120 is a static random access memory (SRAM) fin-PFET. However, the invention is not limited to utilizing the finFETs 110 and 120 in logic and SRAM, but in any environment in which it is desired to degrade a current capacity of one or more finFETs relative to the others.

In one embodiment, the second finFET 120 is in a same electrical circuit as the first finFET 110. The first finFET 110 includes a fin 111 and a gate 112. The second finFET 120 includes a fin 121 and a gate 122. In one embodiment, the fins 111 and 121 are made of silicon. In one embodiment, the fins 111 and 121 have a same height. The gate 112 of the first finFET 110 is covered by an insulation layer 113, such as a nitrite layer. The gate 122 of the second finFET 120 is also covered by an insulation layer 123, such as a nitrite layer. The first and second finFETs 110 and 120 are formed on the same substrate 101.

Figure 16:
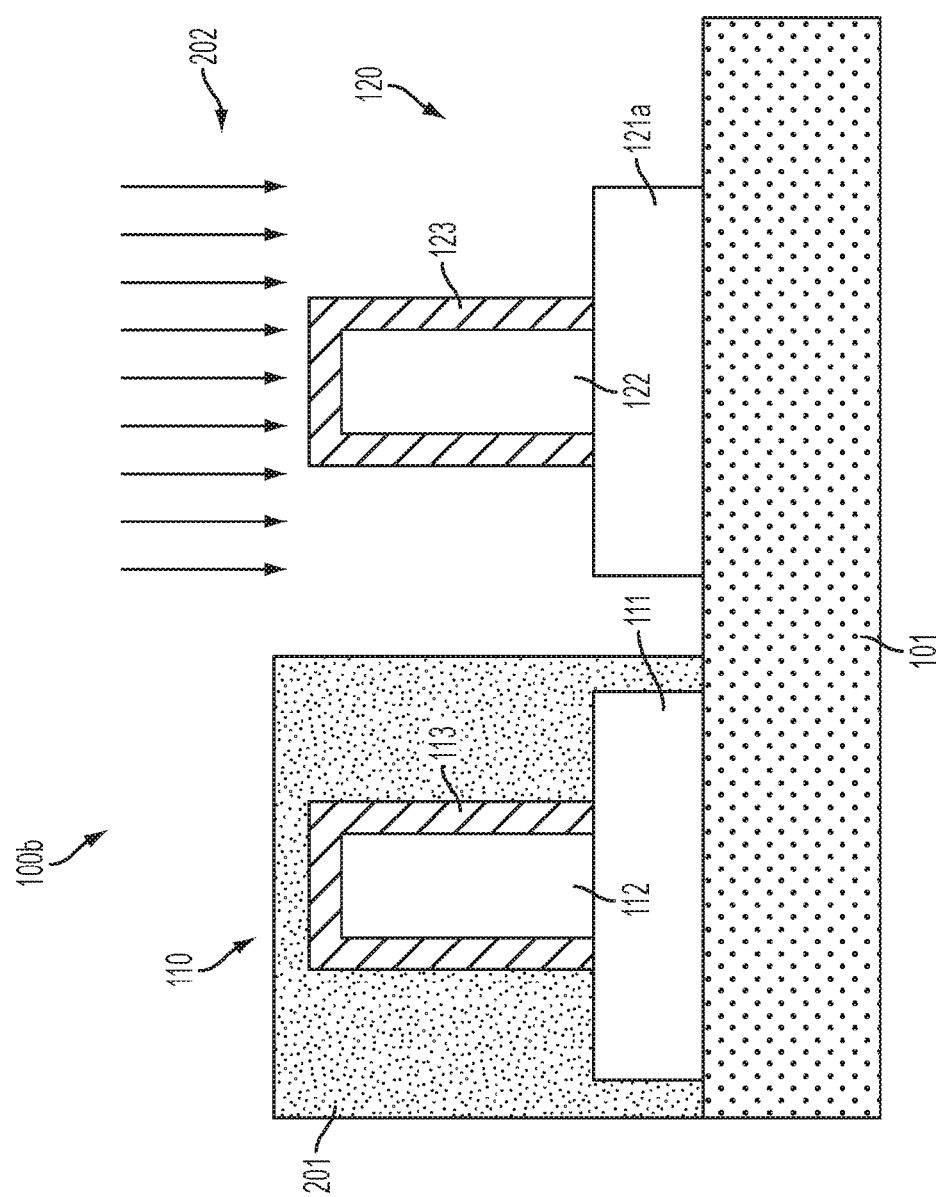
FIG. 16 illustrates the intermediate finFET semiconductor device of FIG. 15 following the formation of a mask over the first finFET.

In FIG. 16, an intermediate fin field-effect transistor (finFET) device 100b is shown having a mask 201 placed over the first finFET 110. The mask 201 may be a lithographic material, for example. As illustrated in FIG. 16, the fin 121 of the second finFET 120 that is not covered by the mask 201 is implanted with a fin-altering material, such as a degrading material 202. The degrading material 202 degrades the fin 121 to reduce a drive current of the fin 121, and to form the degraded fin 121a. In one embodiment, the silicon-degrading material is boron (B) or Germanium (Ge). In one embodiment, the silicon-degrading material alters the physical make-up of the fin 121 by changing the fin 121 from a silicon crystal into an amorphous structure, resulting in a degraded fin 121a on which an epitaxial layer grows more slowly than on a non-degraded fin. In one embodiment, one or both of the amorphous make-up of the degraded fin 121a and the resulting smaller epitaxial layer (described in further detail below) results in a smaller drive current and higher contact resistance than in a fin that has not been implanted with the fin-degrading material.

Figure 17:
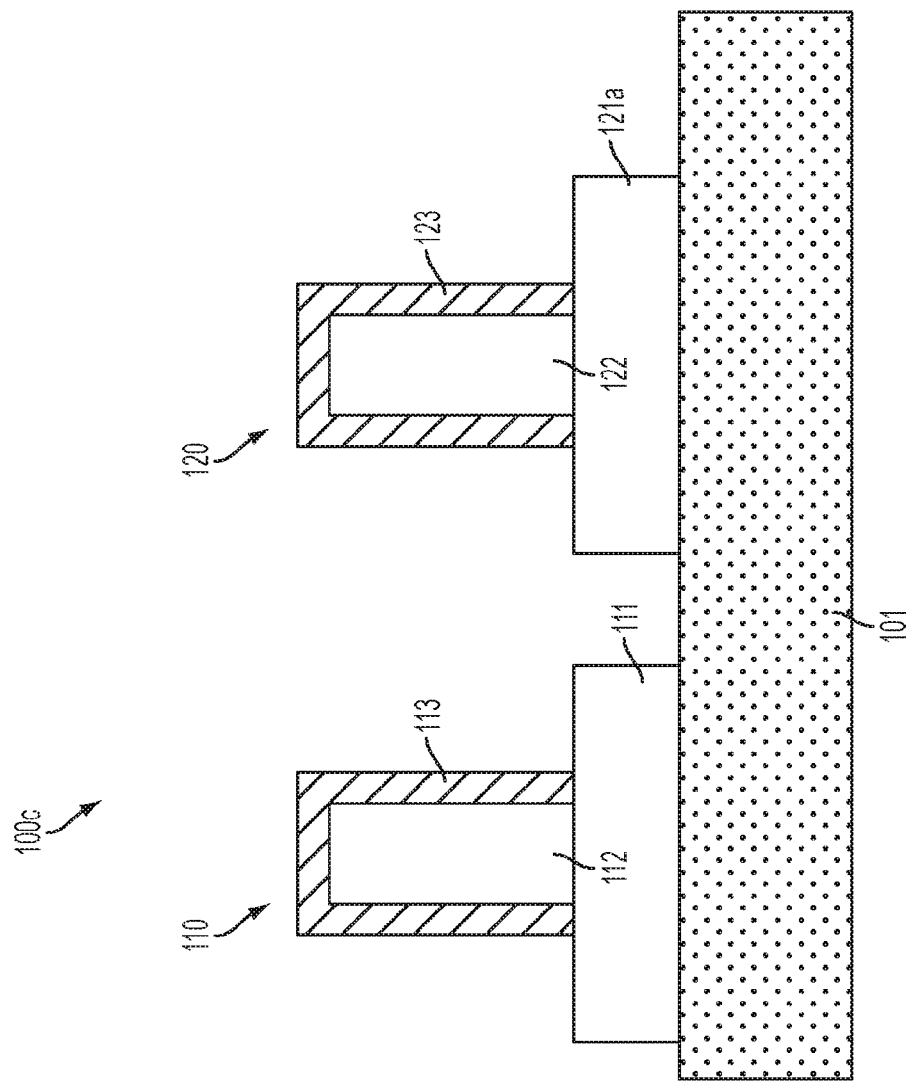
FIG. 17 illustrates the intermediate finFET semiconductor device of FIG. 16 having the mask removed after an implantation process.

In FIG. 17, an intermediate fin field-effect transistor (finFET) device 100c is shown from which the mask 201 of FIG. 16 has been removed.

Figure 18:
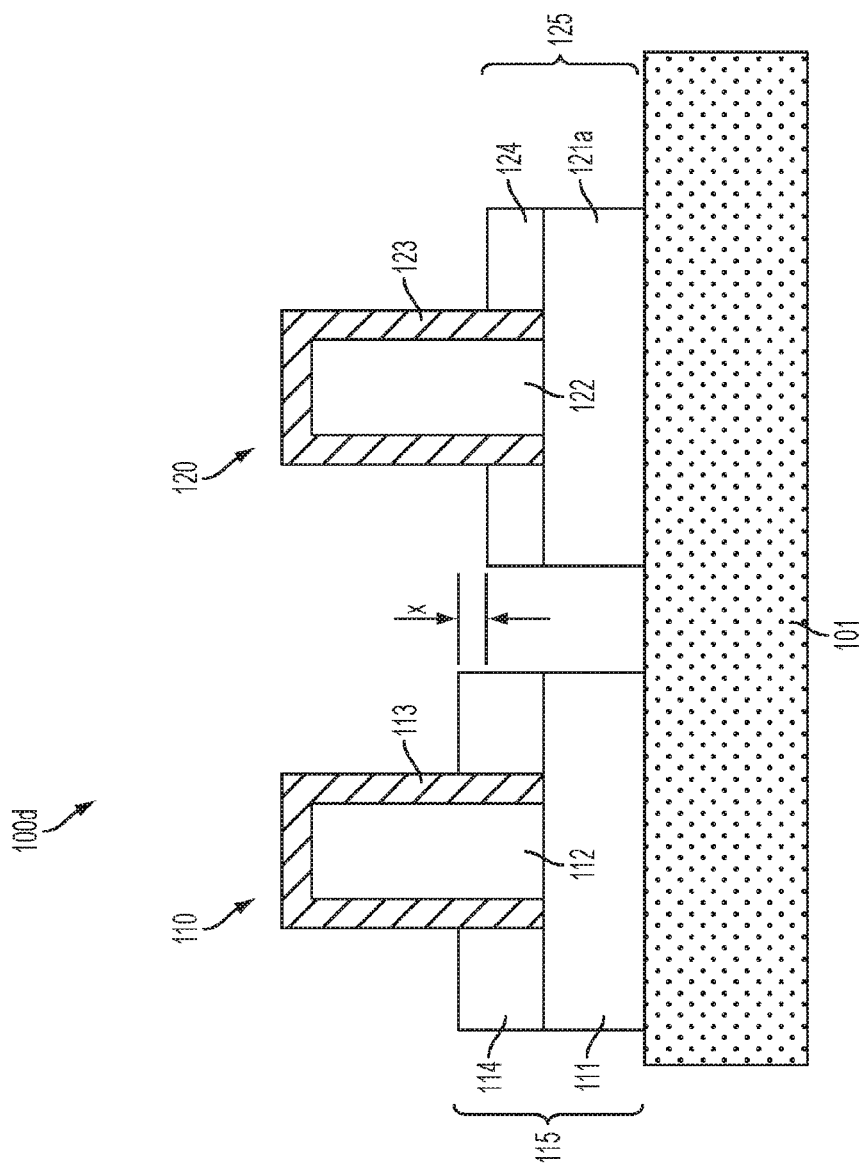
FIG. 18 illustrates the intermediate finFET semiconductor device of FIG. 17 after forming an epitaxial layer fins of the first and second finFETs according to an embodiment of the invention.

In FIG. 18, an intermediate fin field-effect transistor (finFET) device 100d is shown having a first epitaxial layer 114 formed on the fin 111 of the first finFET 110 and a second epitaxial layer 124 formed on the fin 121 of the second finFET 120. In one embodiment, the first and second epitaxial layers 114 and 124 are formed by growing boron-doped silicon germanium (SiGe). Since the fin 121a of the second finFET 120 is degraded, the second epitaxial layer 124 forms more slowly on the fin 121a than the first epitaxial layer 114 forms on the fin 111. Consequently, the fin structure 115 of the first finFET 110, including the fin 111 and the first epitaxial layer 114, has a height greater than the height of the fin structure 125 of the second finFET 120, including the fin 121a and the second epitaxial layer 124. The difference in height between the first fin structure 115 and the second fin structure 125 is illustrated by the reference letter x in FIG. 4. As a result of the difference in height, the first finFET 110 has a different drive current than the second finFET 120, and in particular, a greater drive current. In subsequent fabrication processes (not shown) contacts are formed on the epitaxial layers 114 and 124 and the gates 112 and 122, and wiring layers may also be formed, to form an operational finFET device.

Figure 19:
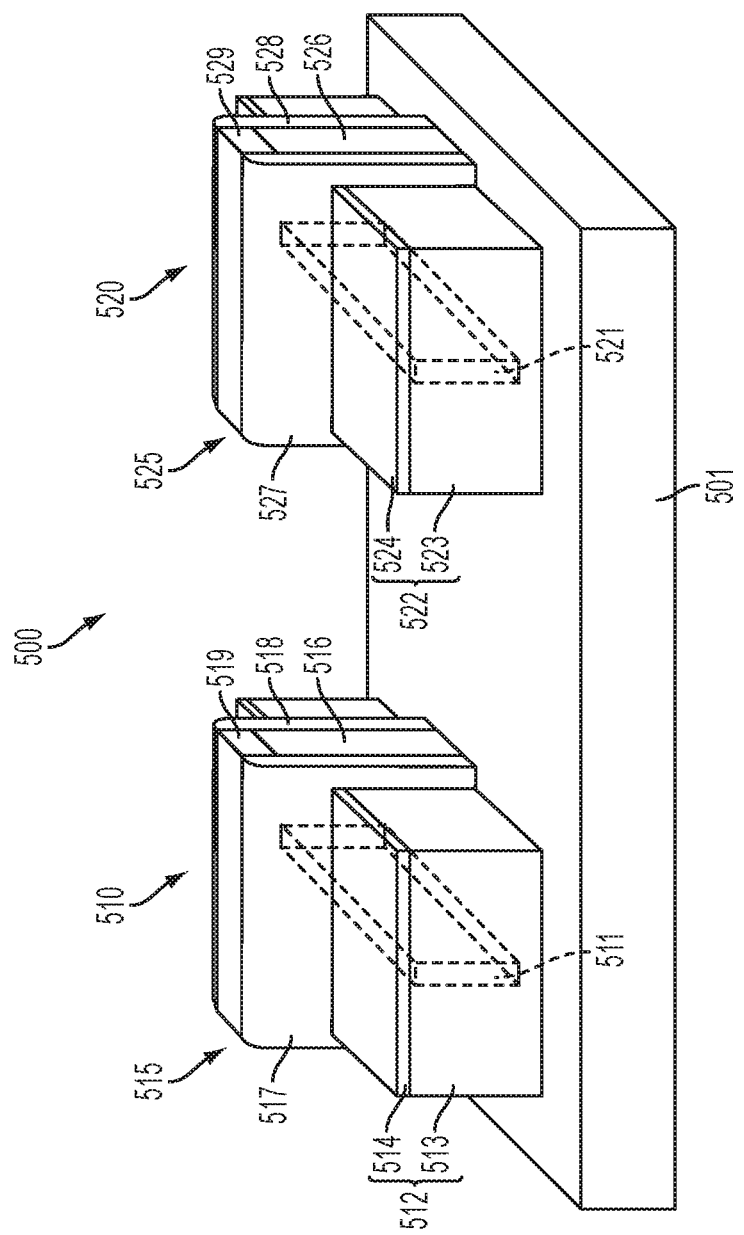
FIG. 19 illustrates a finFET semiconductor device according to another embodiment of the invention.

FIG. 19 illustrates a fin field-effect transistor (finFET) assembly 500 according to an embodiment of the present invention. The finFET assembly 500 includes the substrate 501, a first finFET device 110 and a second finFET device 120. While only two finFET devices are illustrated for purposes of description only, embodiments of the invention encompass any plurality of finFET devices, and in particular, two or more finFET devices configured for performing different functions. The first finFET device 110 includes merged source/drain (SD) regions 512, including a filling layer 513 and a contact layer 514. A gate structure 515 is located between the SD regions 512. In embodiments of the invention, the finFET assembly 500 may represent an electrical circuit connecting the finFETs 510 and 520, a wafer on which the finFETs 510 and 520 are both fabricated or any other assembly including multiple finFETs 510 and 520 formed on the same substrate 501.

The second finFET device 520 also includes merged source/drain (SD) regions 522, including a filling layer 523 and a contact layer 524. The second finFET device 520 also includes a gate structure 525 is located between the SD regions 522.

The first finFET device 510 is formed around a first fin 511 located on the substrate 501, and the second finFET device 520 is formed around a second fin 521 located on the substrate 501. The substrate 501 may include one or more of an insulating material and a semiconductive material, such as a silicon-based material. The fins 511 and 521 may comprise a silicon-based material. In embodiments of the invention, one of the fins 511 or 521 is implanted with a material that causes an epitaxial-growth material to grow on the fin 511 or 521 at a slower rate than on the other fin 511 or 521. For example, in an embodiment in which the fin 521 is implanted with the fin-altering material, an epitaxial-growth material may grow on the fin 521 at a rate slower than the fin 511. Consequently, the fins 511 and 521 may have a same height, but the resulting fill layers 513 and 523 formed as a result of epitaxial growth, may have different heights.

In one embodiment, the contact layers 514 and 524 include a silicide layer. The first gate structure 515 of the first finFET device 510 may include a gate stack layer 516 and a contact layer 519 on the gate stack layer 516. The gate stack layer 516 may include one or more layers of high-dielectric constant (high-k) material under one or more multi-layer metals, doped polysilicon, and silicide. The gate structure 519 may also include insulating layers 517 and 518 disposed on sidewalls of the gate stack layer 516 and contact layer 519. Similarly, the second gate structure 525 of the second finFET device 520 may include a gate stack layer 526 and a contact layer 529 on the gate stack layer 526. The gate structure 525 may also include insulating layers 527 and 528 disposed on sidewalls of the gate stack layer 526 and contact layer 529.

In embodiments of the invention, "degrading" one finFET relative to another finFET is defined as implanting one of the finFETs with a material that causes a different rate of epitaxial growth of silicon or silicon-based materials on the fins of the finFETs. In one embodiment, a fin of the degraded finFET is implanted with a material that hinders the ability of the degraded finFET to epitaxially grow silicon or a silicon-based material that is used for epitaxial growth, such as boron-doped SiGe. For example, while a normal fin may comprise single-crystal silicon, the degraded fin may become amorphous when implanted, hindering epitaxial growth on the fin. Alternatively, a finFET may be implanted with a material to improve its ability to grow silicon or a silicon-based material. The two finFETs are simultaneously submitted to an epitaxial-growth process, and as a result, one of the finFETs has an epitaxial layer larger than the other finFET. In embodiments of the invention, a first set of similarly-charged finFETs (e.g., PFETs) has the same epitaxial layer grown on the similarly-charged finFETs.

Embodiments of the invention relate to degrading one or more electrically-connected finFETs relative to other finFETs. In one embodiment, a fin-PFET of an SRAM cell is connected to a fin-NFET which acts as a pass gate. If the fin-PFET were doped normally and not degraded, the current flowing through the fin-NFET would be a multiple of the current flowing through the fin-PFET. As a result, if the fin-PFET were to have only one fin, the fin-NFET would require two or more fins, increasing a size of the circuit. In embodiments of the invention, the fin-PFET is degraded to decrease a drive current, and decrease a current capacity, of the fin-PFET. As a result, the current capacity may be made similar to that of the fin-NFET having only one fin, thereby decreasing the circuit size.

In another embodiment, a ratioed logic circuit includes a keeper fin-PFET connected in series with one or more fin-NFETs, which are connected in parallel with each other. In such an embodiment, the fin-PFET may be degraded to decrease the drive current, and decrease the current capacity of the fin-PFET, such that the current decreases through the fin-NFETs, allowing for smaller fin-NFETs having few fins. Embodiments of the invention are not limited to the specific circuits described herein, but to any circuit in which current flowing through a fin-NFET is a multiple of current flowing through a fin-PFET electrically connected to the fin-NFET.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method comprising:
    selectively degrading a current capacity of a first finned-field-effect-transistor (finFET) relative to a second finFET by forming a material on a fin of the first finFET to increase a current resistance of the first finFET, the second finFET being electrically connected to the first finFET in a circuit such that a current flow through the second finFET is a multiple of a current flow through the first finFET.

2. The method of claim 1, wherein the first finFET is a p-type field-effect transistor (fin-PFET) and the second finFET is an n-type field-effect transistor (fin-NFET).

3. The method of claim 2, wherein the circuit includes a first fin-PFET configured to be used in a static random-access memory (SRAM) circuit and a second fin-PFET configured to be used in a logic circuit, and
    only the first fin-PFET is degraded among the first and second fin-PFETs.

4. The method of claim 2, wherein the circuit includes a plurality of fin-PFETs and a plurality of fin-NFETs, and
selectively degrading the current capacity of the first finFET comprises:
epitaxially growing a same material on the fins of each of the fin-NFETs; and
epitaxially growing a different material on the first finFET than on each fin-PFET that is not to be degraded.

5. The method of claim 4, wherein the different material epitaxially grown on the first finFET is non-doped silicon.

6. The method of claim 4, wherein the material epitaxially grown on each of the fin-PFETs that is not to be degraded is boron-doped silicon germanium.

7. The method of claim 4, wherein the material epitaxially grown on each of the fin-NFETs is silicon phosphorus.

8. The method of claim 4, wherein selectively degrading the current capacity of the first fin-PFET comprises:
degrading the current capacity of the first fin-PFET by masking each finFET except the first fin-PFET, etching an insulation layer from a fin of the first fin-PFET, and epitaxially growing non-doped silicon on the fin of the first fin-PFET;
forming each fin-PFET that is not to be degraded by masking each finFET except the fin-PFETs that are not to be degraded, etching an insulation layer from fins of the fin-PFETs that are not to be degraded, and epitaxially growing a material for decreasing a current resistance between the fins and a contact on the fins of the fin-PFETs that are not to be degraded; and
forming each fin-NFET by masking each fin-PFET, etching an insulation layer from fins of each fin-NFET, and epitaxially growing a material for decreasing a current resistance between the fins of the fin-NFETs and contacts on the fins of the fin-NFETs.

9. The method of claim 1, wherein the first finFET has a first channel charge type, and the second finFET has the first channel charge type.

10. The method of claim 9, wherein the second finFET has a material formed on a fin of the second finFET to increase a current resistance of the second finFET relative to the first finFET.

11. The method of claim 10, wherein the first finFET and the second finFET are part of a same static random access memory (SRAM) cell.

12. The method of claim 9, wherein the first finFET is located in a logic circuit, and the second finFET is located in an SRAM circuit.

13. The method of claim 1, wherein the first finFET is a PFET.

14. The method of claim 1, wherein the second finFET is an NFET.

15. The method of claim 1, wherein the first finFET is a PFET and the second finFET is a PFET.

* * * * *